US006960776B2

(12) United States Patent
Machi

(10) Patent No.: US 6,960,776 B2
(45) Date of Patent: Nov. 1, 2005

(54) IR DIODE BASED HIGH INTENSITY LIGHT

(75) Inventor: Nicolo F. Machi, Springfield, OH (US)

(73) Assignee: Honeywell International Inc., Morristown, NJ (US)

( * ) Notice: Subject to any disclaimer, the term of this patent is extended or adjusted under 35 U.S.C. 154(b) by 177 days.

(21) Appl. No.: 10/000,206

(22) Filed: Nov. 2, 2001

(65) Prior Publication Data
US 2002/0070360 A1 Jun. 13, 2002

Related U.S. Application Data

(63) Continuation-in-part of application No. 09/217,221, filed on Dec. 21, 1998, now abandoned.

(51) Int. Cl.$^7$ .................................................. G01J 1/00
(52) U.S. Cl. ................ 250/504 R; 250/504; 250/504 H
(58) Field of Search ............................ 250/504 R, 504, 250/504 H; 372/100; 313/500

(56) References Cited

U.S. PATENT DOCUMENTS

| | | | |
|---|---|---|---|
| 3,805,347 A | * | 4/1974 | Collins et al. ................. 445/24 |
| 3,833,799 A | | 9/1974 | Audet ........................ 240/6.41 |
| 3,860,847 A | | 1/1975 | Carley ........................ 313/110 |

(Continued)

FOREIGN PATENT DOCUMENTS

| | | |
|---|---|---|
| DE | 19649650 A1 | 6/1998 |
| DE | 19706279 A1 | 8/1998 |
| DE | 3719338 A1 | 12/1998 |
| JP | 62139367 A | 6/1987 |

OTHER PUBLICATIONS

Hecht, E., Optik, Addison–Wesley 1989, pp. 136–140.
SZE, Physics of Semiconductor Devices, 2$^{nd}$ Edition, John Wiley & Sons, 1981, Chapter 12, pps 681–742.

(Continued)

Primary Examiner—Nikita Wells
Assistant Examiner—Anthony Quash
(74) Attorney, Agent, or Firm—Larry J. Palguta

(57) ABSTRACT

The present invention is directed to an infrared light assembly (10, 30, 80, 90). A preferred embodiment of the light assembly (10, 30, 80, 90) may be used on aircraft or other vehicles for landing, taxi mode, or search operations. The light assembly (10, 30, 80, 90) preferably only requires about 10 to 20 watts of power. The light assembly (10, 30, 80, 90) may include a housing (12, 32, 82), a base (14, 34, 50), an IR diode (16, 36, 60), and an aspheric lens (18, 38). The base (14, 34, 50) is preferably connected to the bottom portion (22) of the housing(12, 32, 82), and the aspheric lens (18, 38) is preferably connected to the top portion (24) of the housing (12, 32, 82). The IR diode (16, 36, 60) may be mounted on the base (14, 34, 50). The housing (12, 32, 82) and the base (14, 34, 50) preferably have high thermal conductivity, and they preferably act as heat sinks. In addition, a plurality of thermal electric coolers (20, 40, 70) may be positioned between the base (14, 34, 50) and the IR diode (16, 36, 60) for additional dissipation of the heat generated by the light assembly. The IR diode (16, 36, 60) is adapted to emit infrared light. The light assembly (10, 30, 80, 90) preferably maintains a substantially constant operating temperature so that the peak emission of the IR diode (16, 36, 60) is substantially maintained. The infrared light may radiate through the hollow of the housing(12, 32, 82) to the aspheric lens (18, 38). The aspheric lens (18, 38) is preferably adapted to collimate infrared light. As a result, the light assembly (10, 30, 80, 90) may provide a collimated beam of infrared light having a NVIS radiant intensity greater than about 2.

24 Claims, 4 Drawing Sheets

U.S. PATENT DOCUMENTS

| | | | | |
|---|---|---|---|---|
| 4,185,891 A | | 1/1980 | Kaestner | 350/167 |
| 4,267,559 A | * | 5/1981 | Johnson et al. | 257/99 |
| 4,547,701 A | | 10/1985 | Taylor | 313/500 |
| 4,707,595 A | | 11/1987 | Meyers | 250/504 |
| 4,729,076 A | | 3/1988 | Masami | 362/235 |
| 4,738,534 A | | 4/1988 | Houseman | 356/414 |
| 4,803,689 A | | 2/1989 | Shibanuma | |
| 4,808,830 A | | 2/1989 | Burgis | 250/505.1 |
| 4,866,285 A | | 9/1989 | Simms | 250/495.1 |
| 4,947,291 A | | 8/1990 | McDermott | 362/19 |
| 4,948,210 A | | 8/1990 | Simms | 350/1.4 |
| 4,991,183 A | | 2/1991 | Meyers | 372/100 |
| RE33,572 E | | 4/1991 | Meyers | 250/504 |
| 5,282,589 A | | 2/1994 | Branigan | 244/114 |
| 5,500,768 A | * | 3/1996 | Doggett et al. | 359/652 |
| 5,595,435 A | * | 1/1997 | Palmer et al. | 362/109 |
| 5,685,637 A | | 11/1997 | Chapman | 362/263 |
| 5,695,272 A | | 12/1997 | Snyder | 362/231 |
| 5,758,951 A | | 6/1998 | Haitz | 362/259 |
| 5,763,882 A | | 6/1998 | Klapper | 250/332 |
| 5,870,215 A | * | 2/1999 | Milano et al. | 398/108 |
| 6,007,218 A | * | 12/1999 | German et al. | 362/259 |
| 6,142,650 A | | 11/2000 | Brown | 362/259 |
| 6,609,812 B2 | | 8/2003 | Machi et al. | |

OTHER PUBLICATIONS

"BRIGHTSTAR II Infra–Red Search and Landing Light" publication; LFD Limited, Hampshire, England.

"BRIGHTSTAR III" Low Weight Infra–Red Search and Landing Light publication; LFD Limited, Hampshire, England.

* cited by examiner

IR DIODE BASED HIGH INTENSITY LIGHT

BACKGROUND AND SUMMARY OF THE INVENTION

This is a continuation-in-part of U.S. patent application Ser. No. 09/217,221, filed Dec. 21, 1998 now abandoned.

The present invention relates generally to a light assembly, and more particularly, to an infrared light assembly that may be used on aircraft or other vehicles for landing, taxi mode, or search operations.

Infrared light sources may be useful in many different applications. For example, the military has extensively used infrared light sources for strategic military operations to provide night vision of terrain, people, objects, and targets. An infrared light source may be secured to an airplane, helicopter, or practically any other vehicle for use as a head light or a search light. In addition, an infrared light source may be used in a hand-held searchlight, or it may be mounted on a weapon such as a gun to provide an aiming light. In addition, infrared light sources may be used in many other military and non-military applications where visible light is not desired.

Infrared light sources utilized for exterior compatible lighting may be incandescent, electroluminescent, or IRLED. Incandescent sources may be filtered such that energy in the visible spectrum is not emitted. For example, category II Night Vision Imaging System (NVIS) searchlights may utilize black glass filtering systems. Other examples of category II lights include floodlights, fuel probe inspection lights, refueling lights, and landing lights.

Known infrared light sources may generate a substantial amount of heat. As the ambient temperature increases, the thermal signature increases. The halogen bulb energy spectrum encompasses the visible spectrum of radiation (380 to 770 nm) and the infrared spectrum of radiation (which is comprised of a near infrared region, 770 to 1400 nm, and a far infrared region, 1.4 to 1000 mm). Gen III goggle response limit is 930 nm. Thus, the wavelengths past 930 nm may not only be unnecessary, but also detrimental due to the high temperatures. This thermal radiation is in addition to the 200 watts which may be required to operate the halogen bulb.

The high temperatures generated by known infrared light sources may have many detrimental effects. The high temperatures may lead to material problems. The high temperatures may also lead to failure of the infrared light source (a searchlight, for example) and the surrounding components as well as the halogen bulb itself. In fact, the product life of known halogen bulb/black glass filtering systems may be rated at only approximately 50 hours. In addition, the high temperatures may cause lack of covertness. For instance, the high thermal signature may be detectable by forward looking infrared (FLIR), and the black glass filter does not filter all visible frequencies, i.e. the unit glows red.

Emitted infrared light may tend to diverge greatly and lose its intensity as it radiates from its source. As a result, known infrared light sources may require reflectors in order to produce a desired beam of infrared light. However, reflectors may increase the complexity and cost of the infrared light source.

In light of the shortcomings of known infrared light sources, a need exists for an improved infrared light assembly that is adapted to produce a high intensity, concentrated beam of infrared light. Another need exists for an improved method of dissipating the heat generated by an infrared light source so that it maintains peak emission. A need also exists for an infrared light assembly that requires less power to operate in order to minimize the thermal signature of the infrared light. Still another need exists for an infrared light assembly that has a longer product life.

Preferred embodiments of the present invention satisfy some or all of these needs. A preferred embodiment of a light assembly of the present invention may utilize an infrared light emitting diode, also well-known in the art as an "IR diode." It should be noted that an IR light emitting diode has optical characteristics that differ from the characteristics of a "laser diode." By its nature a laser light source produces coherent light which is highly collimated and directional. In contrast, IR light emitting diodes produce non-coherent light. In addition, IR light emitting diodes have a high refractive index and an isotropic spontaneous emission pattern.

A preferred embodiment of a light assembly of the present invention may also utilize heat dissipation means to maintain the infrared light emitting diode's temperature in order to prevent the frequency spectrum of the emitted light from shifting due to temperature effects, which is a characteristic of infrared light emitting diodes. Further, a preferred embodiment of a light assembly of the present invention may utilize an aspheric lens to provide a high intensity beam of infrared light.

A preferred embodiment of the present invention may emit a collimated beam of infrared light having a NVIS radiant intensity (NRI) greater than about 2:

$$NRI = \int_{450}^{930} G(\lambda) \times N(\lambda) \times d\lambda$$

where: $G(\lambda)$=relative spectral response to NVIS
$N(\lambda)$=spectral radiant intensity of the light source (watt/steradian nanometer)
$d\lambda$=wavelength increment Moreover, a preferred embodiment of the present invention may only require about 10 to 20 watts to operate. This may be a 90 to 95 percent power reduction as compared to known halogen bulb/black glass filter technology. The significant power reduction preferably minimizes the thermal signature of the infrared light. As a result, a preferred embodiment of the present invention may have a product life rated in the thousands of hours.

The present invention comprises a light assembly comprising: a thermally conductive housing, said housing having a bottom portion and a top portion, said housing defining a hollow; a thermally conductive base, said base located at said bottom portion; at least one light emitting diode disposed at said base, said light emitting diode adapted to emit infrared light, said infrared light being non-coherent and non-directional; and at least one aspheric lens connected to said top portion of said housing, said aspheric lens adapted to collimate infrared light to produce a beam of infrared light; wherein said infrared light emitted by said light emitting diode radiates through said hollow to said aspheric lens.

In addition to the novel features and advantages mentioned above, other objects and advantages of the present invention will be readily apparent from the following descriptions of the drawings and preferred embodiments.

DETAILED DESCRIPTION OF PREFERRED EMBODIMENT(S)

The present invention is directed to an infrared light assembly. Preferred embodiments of the infrared light assembly of the present invention may be used on aircraft or other vehicles for landing, taxi mode, or search operations. Preferred embodiments of the infrared light assembly of the present invention may also be used in many other applications which utilize infrared light.

Figure 1:
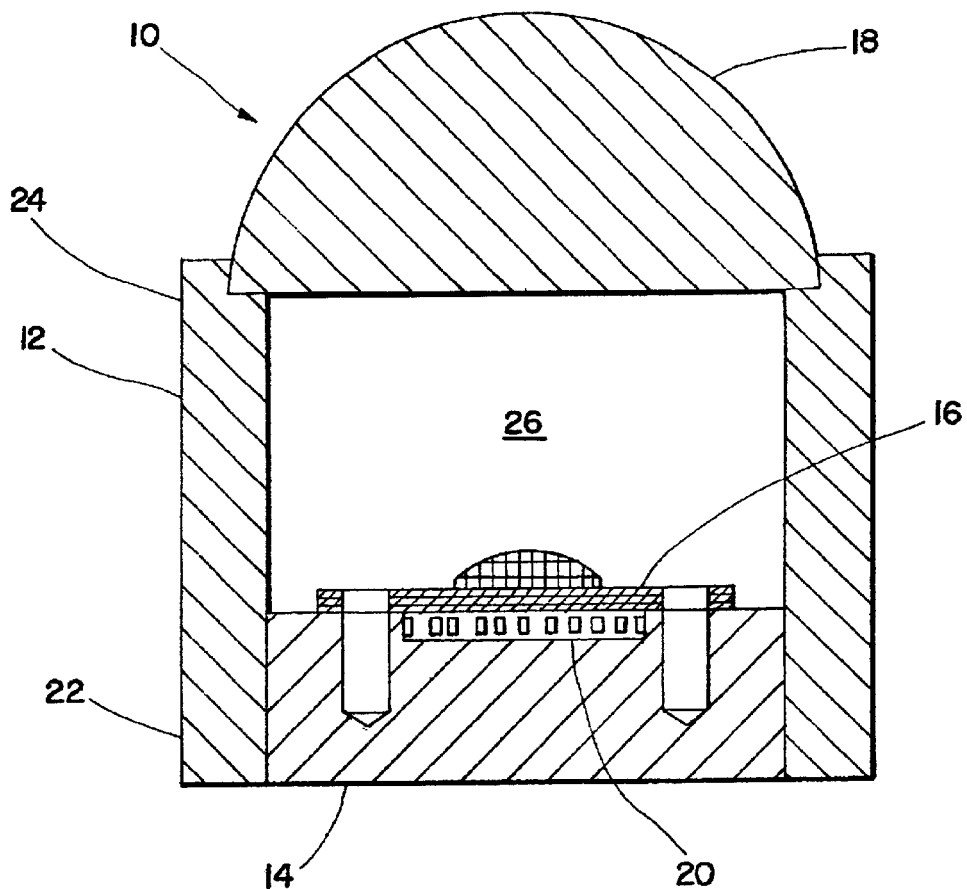
FIG. 1 is a cross sectional view of a preferred embodiment of a light assembly of the present invention.

FIG. 1 shows one embodiment of a light assembly of the present invention. The light assembly 10 is comprised of a housing 12, a base 14, an IR light emitting diode 16, an aspheric lens 18, and optional thermal electric coolers 20. The light assembly 10 preferably only requires about 10 to about 20 watts to operate, and it preferably provides a collimated beam of infrared light having a NVIS radiant intensity greater than about 2. However, those skilled in the art should recognize that the power requirement and the radiant intensity of the emitted infrared light may vary based on the components, the construction, and the application.

The housing 12 has a bottom portion 22 and a top portion 24, and the housing 12 defines a hollow 26. The base 14 is connected to the bottom portion 22 of the housing 12. The IR diode 16 is connected the base 14 so that it may emit infrared light through the hollow 26. The IR diode 16 preferably only requires about 6 watts and emits non-coherent infrared light. The housing 12 and the base 14 are preferably comprised of material that is thermally conductive, and the housing 12 and the base 14 preferably act as heat sinks for heat generated by the IR diode 16. The aspheric lens 18 is connected to the top portion 24 of the housing 12. The aspheric lens 18 is preferably adapted to collimate infrared light. In addition, the aspheric lens is preferably positioned relative to the IR diode 16 such that it may collimate infrared light emitted by the IR diode 16.

The housing 12 is preferably a cylinder. The base 14 may be integrally connected to the housing 12. The housing 12 and the base 14 may be comprised of different materials. However, it is preferred that the housing 12 and the base 14 are both comprised of thermally conductive material such as aluminum for maximum dissipation of the heat generated by the light assembly 10.

It is preferred that the housing 12 and the base 14 help to substantially maintain a desired operating temperature in the light assembly 10 so that peak emission of the IR diode 16 is substantially maintained. Those skilled in the art should recognize that the peak frequency of high intensity IR diodes may shift to the right (larger wavelengths) as the temperature increases (nominally about 0.35 nm/degree Celsius). In light of this characteristic of high intensity IR diodes, additional means for dissipating the heat generated by the IR diode 16 may be used if desired or necessary to substantially maintain a desired operating temperature in the light assembly 10.

In this embodiment, the light assembly 10 includes at least one thermal electric cooler 20 for additional dissipation of the heat generated by the IR diode 16. A thermal electric cooler 20 preferably only requires between about 4 and 8 watts. One example of a thermal electric cooler 20 is made by Melcor of Trenton, N.J. The thermal electric cooler(s) 20 are preferably connected to the IR diode 16. It is preferred that the thermal electric cooler(s) 20 are connected between the IR diode 16 and the top surface of the base 14 so that the base 14 may serve as an effective heat sink for the thermal electric cooler(s) 20.

It is preferred that the IR diode 16 has a peak emission of about 880 nm. One example of an IR diode 16 that may be used in the present invention is a single 9 chip array IR diode. Another example of an IR diode 16 is a high power GaAIAs IRLED which is available from Opto Diode Corp. of Newbury Park, Calif.

The light assembly 10 may be a redundant light source. In other words, the light assembly 10 may include more than one IR diode 16 and, if desired, more than one aspheric lens 18. By providing more than one IR diode 16, the light assembly 10 is preferably enabled to provide infrared light if fewer than all IR diodes 16 fail due to normal wear and tear or any other reason.

The distance between the IR diode 16 and the aspheric lens 18 may vary in order to achieve a desired divergence of the infrared light exiting the light assembly 10. For example, the distance may be such that the light assembly 10 provides a wide angle beam for illuminating a zone, or the distance may be such that the light assembly 10 provides a narrow, collimated beam of infrared light. In addition, the IR diode 16 may be offset from the focal point of the aspheric lens 18. In a preferred embodiment of the present invention, the IR diode 16 is slightly offset from the focal point of the aspheric lens 18.

The aspheric lens 18 preferably has a substantially flat inner surface and a convex outer surface. One example of an aspheric lens 18 is made by Edmund Scientific of New Jersey. The surfaces and curvature of the aspheric lens 18 may be varied in order to achieve a desired refraction of the infrared light.

Figure 2:
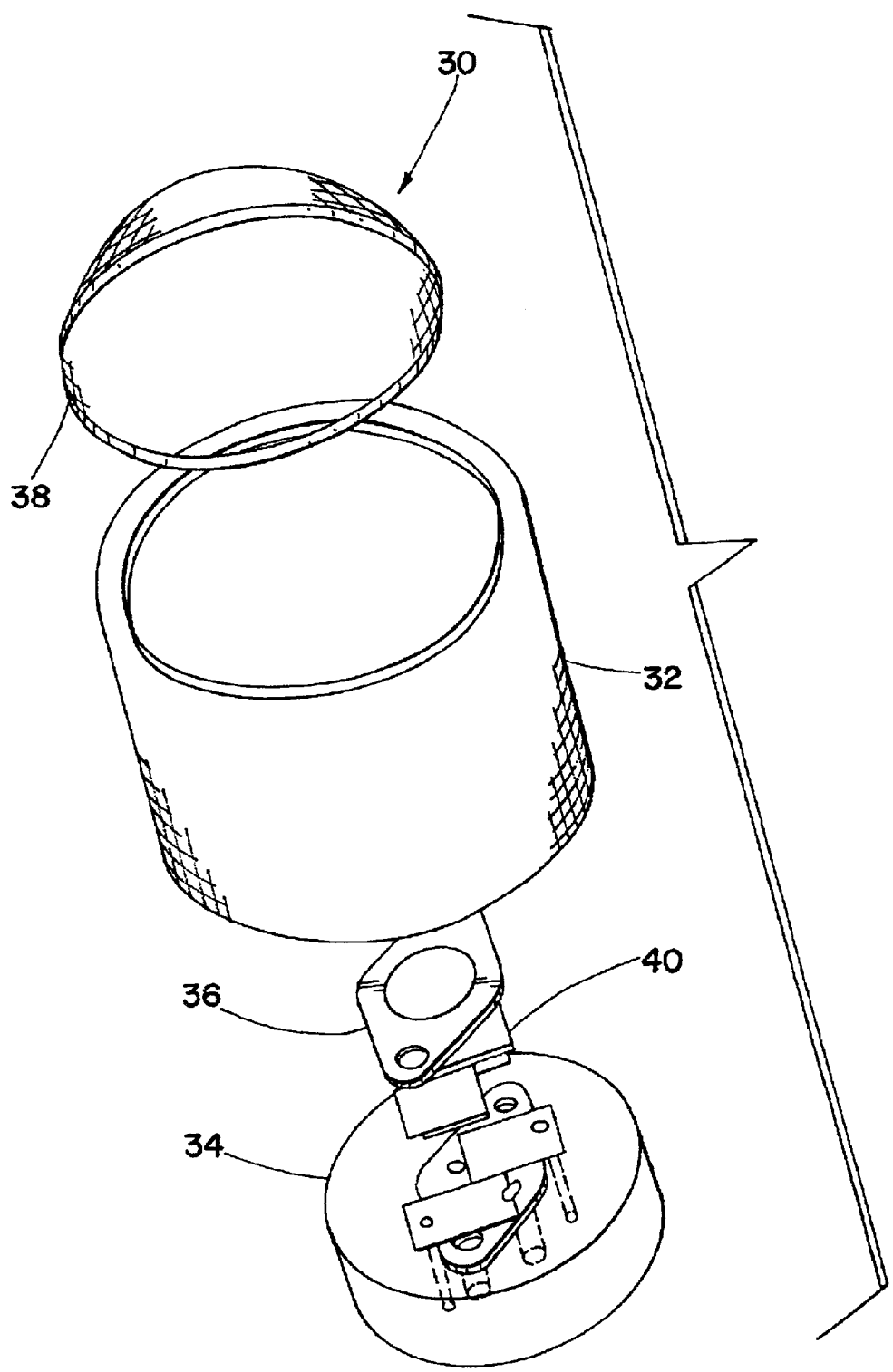
FIG. 2 is a perspective fragmentary view of another preferred embodiment of a light assembly of the present invention.

FIG. 2 is a fragmentary view of another embodiment of a light assembly of the present invention. Similar to the light assembly 10, the light assembly 30 includes a housing 32, a base 34, an IR diode 36, an aspheric lens 38, and optional thermal electric coolers 40.

Figure 3:
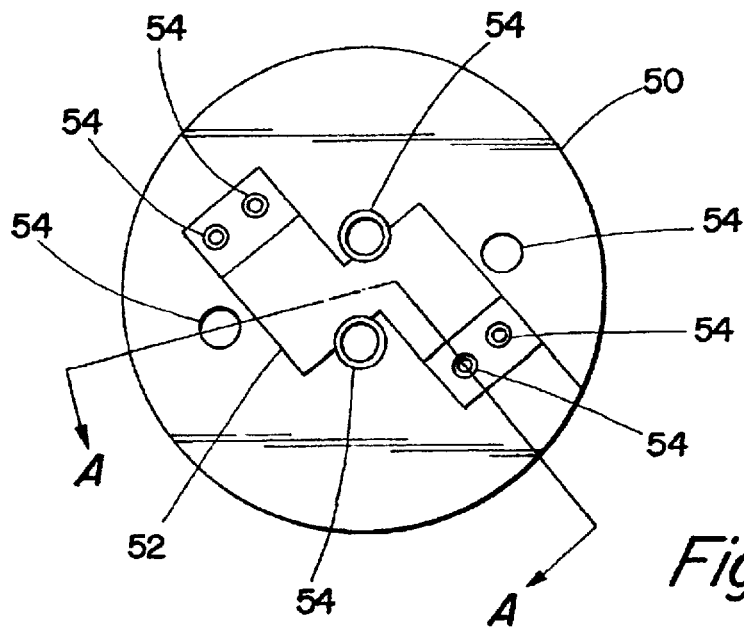
FIG. 3 is a top plan view of a preferred embodiment of a base of the present invention.
Figure 4:
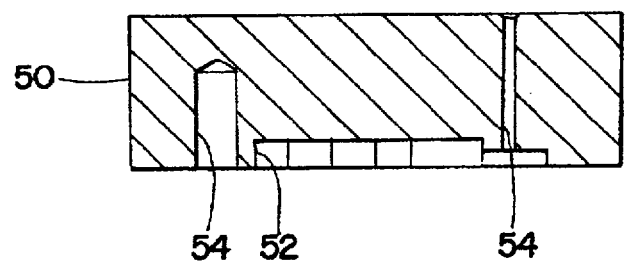
FIG. 4 is a cross sectional view of the base of FIG. 3 along the line A—A.
Figure 5:
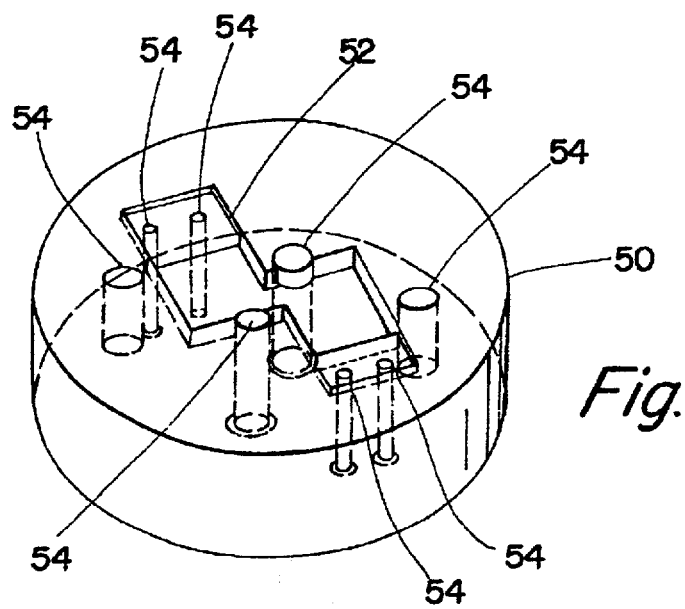
FIG. 5 is a perspective view of the base of FIG. 3.

FIGS. 3 through 5 are various views of a preferred embodiment of a base of the present invention. As shown in these figures, the top surface of the base 50 may have a depressed portion 52 to facilitate assembly. The depressed portion 52 is preferably adapted to receive a heat dissipation device such as thermal electric coolers. If thermal electric coolers are used, the IR diode is preferably isolated from the base 50. The depressed portion 52 preferably facilitates the transfer of heat from the heat dissipation device to the base 50. Although not depicted in these figures, the base may have a depressed portion which is adapted to receive an IR diode if thermal electric coolers are not used.

Referring back to FIGS. 3 through 5, the base 50 may have one or more penetrations 54 therein. The penetrations 54 may serve many different purposes. For example, some of the penetrations 54 may provide access for power connections to an IR diode and/or an optional heat dissipation device. Also, other penetrations 54 may serve as female receptacles for an IR diode and/or an optional heat dissipation device to be anchored or otherwise connected to the base 50 via male members. The male members may be comprised of thermally conductive material to facilitate the dissipation of heat.

Figure 6:
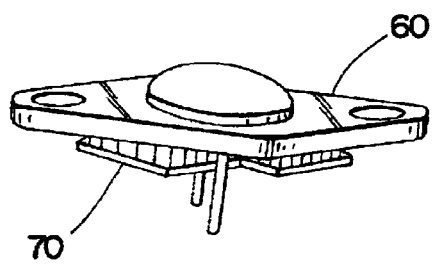
FIG. 6 is a perspective view of preferred embodiments of an IR diode and thermal electric coolers of the present invention.
Figure 7:
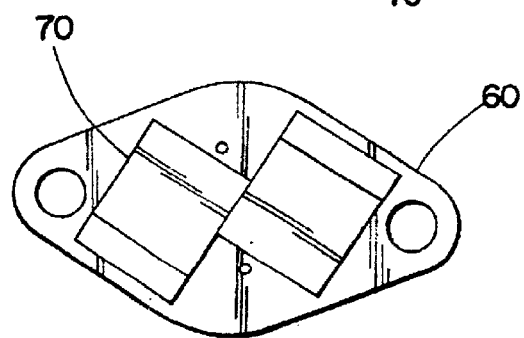
FIG. 7 is a bottom plan view of the IR diode and thermal electric coolers shown in FIG. 6.

FIGS. 6 and 7 show an example of a connection between one embodiment of an IR diode and one embodiment of thermal electric coolers. The thermal electric coolers 70 may be connected to the IR diode 60 and the base by conventional means. For example, the thermal electric coolers 70 may be abutted against the IR diode 60 and the base, or a thermally conductive adhesive such as Dow Corning 340 silicone heat sink compound may be used to secure the thermal electric coolers 70 to the IR diode 60 and the base.

Figure 8:
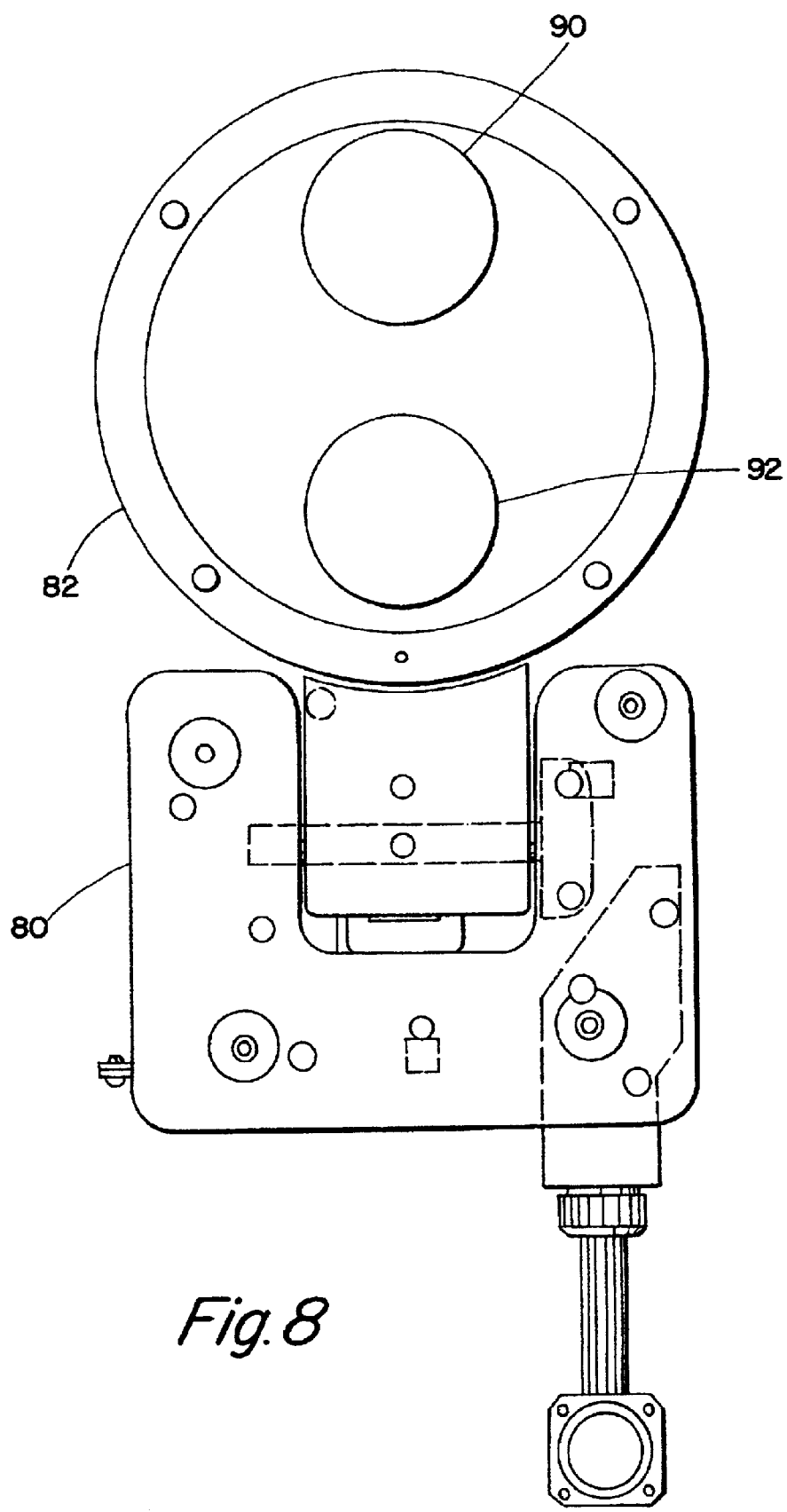
FIG. 8 is a top plan view of a preferred embodiment of a light assembly of the present invention installed in a search light.

FIG. 8 illustrates an example of an application of a preferred embodiment of a light assembly of the present invention. The search light 80 may be adapted to extend, retract, and rotate the housing or lamp head 82 over a range of operational positions. The infrared light assembly 90 may be mounted in the lamp head 82. A visible light assembly 92 may also be mounted in the lamp head 82. As described in U.S. Pat. No. 5,695,272, the search light 80 may include circuitry which enables the light source to be changed from visible light to infrared light by simply flipping a switch. The disclosure of U.S. Pat. No. 5,695,272 is hereby incorporated herein by reference.

The light assembly of the present invention may be utilized to provide a collimated beam of infrared light or varying degrees of wide angle beams of infrared light. For example, the aspheric lens may be modified to achieve a desired beam of infrared light. For another example, the spatial relationship between the IR diode and the aspheric lens may be changed to achieve a desired result.

Those skilled in the art should recognize that NVIS radiant intensity is additive. One module of the present invention may produce an NVIS radiant intensity value of 2 or greater. Thus, two modules, for example, may produce an NVIS radiant intensity value of 4 or greater.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, those skilled in the art will realize that many variations and modifications may be made to affect the described invention. Many of those variations and modifications will provide the same result and fall within the spirit of the claimed invention.

What is claimed is:

1. A light assembly comprising
   a thermally conductive housing, said housing having a bottom portion and a top portion, an interior surface of said housing defining a hollow, an exterior surface of said housing being an exterior surface of the lighting assembly;
   a thermally conductive base, said base composed of a single thermally conductive material, said base being connected to said bottom portion of said housing, an exterior surface of said base being another exterior surface of the light assembly;
   at least one infrared (IR) light emitting diode attached to, but electrically isolated from, an interior surface of said base said IR light emitting diode adapted to emit infrared light, said infrared light being non-coherent and non-directional; and
   at least one collimating lens connected to said top portion of said housing, said collimating lens adapted to collimate infrared light to produce a beam of infrared light output from the light assembly;
   wherein said infrared light emitted by said IR light emitting diode radiates in a direct path through said hollow, the direct path leading from said IR light emitting diode to said collimating lens, and
   said base directly transfers heat generated by said IR light emitting diode to the exterior of the light assembly.

2. The light assembly of claim 1, wherein said housing and said base are comprised of aluminum.

3. The light assembly of claim 1, wherein said housing is substantially cylindrical.

4. The light assembly of claim 1, wherein said base is integrally connected to said housing.

5. The light assembly of claim 1, wherein said light assembly is adapted to provide infrared light having a NVIS radiant intensity greater than about 2.

6. The light assembly of claim 1, wherein said light assembly substantially maintains a predetermined operating temperature such that the peak emission of said light emitting diode is substantially maintained.

7. The light assembly of claim 6, wherein the peak emission of said light emitting diode is substantially maintained at about 880 nm.

8. The light assembly of claim 1, wherein the power requirement of said light assembly is in the range from about 10 watts to about 20 watts.

9. A lamp head in which the light assembly of claim 1 is located.

10. The light assembly of claim 1, wherein the collimating lens is an aspheric lens.

11. The light assembly of claim 10, wherein said aspheric lens has a focal point, and said light emitting diode is offset slightly from said focal point.

12. The light assembly of claim 10, wherein said aspheric lens has a substantially flat inner surface and a convex outer surface.

13. A light assembly comprising:
   a thermally conductive housing, said housing having a bottom portion and a top portion, an interior surface of said housing defining a hollow, an exterior surface of said housing being an exterior surface of the lighting assembly;
   a thermally conductive base, said base composed of a single thermally conductive material, said base being connected to said bottom portion of said housing, an exterior surface of said base being another exterior surface of the light assembly;
   at least one infrared (IR) light emitting diode disposed at, but electrically isolated from, said base, said light emitting diode adapted to emit infrared light, said infrared light being non-coherent and non-directional;
   at least one thermal electric cooler connected to said light emitting diode, said at least one thermal electric cooler adapted to dissipate heat generated by said light emitting diode to minimize light emission outside the infrared spectrum of radiation; and
   at least one collimating lens connected to said top portion of said housing, said collimating lens adapted to collimate infrared light to produce a beam of infrared light output from the light assembly;

wherein said infrared light emitted by said light emitting diode radiates in a direct path through said hollow, the direct path leading from said IR light emitting diode to said collimating lens, and said base directly transfers heat generated by said IR light emitting diode to the exterior of the light assembly.

14. The light assembly of claim 13, wherein said at least one thermal electric cooler is positioned between said base and said light emitting diode.

15. The light assembly of claim 13, wherein said housing and said base are comprised of aluminum.

16. The light assembly of claim 13, wherein said housing is substantially cylindrical.

17. The light assembly of claim 13, wherein said base is integrally connected to said housing.

18. The light assembly of claim 13, wherein said light assembly is adapted to provide infrared light having a NVIS radiant intensity greater than about 2.

19. The light assembly of claim 13, wherein said light assembly substantially maintains a predetermined operating temperature such that the peak emission of said light emitting diode is substantially maintained.

20. The light assembly of claim 13, wherein the power requirement of said light assembly is in the range from about 10 watts to about 20 watts.

21. A lamp head in which the light assembly of claim 13 is located.

22. The light assembly of claim 13, wherein the collimating lens is an aspheric lens.

23. The light assembly of claim 22, wherein said aspheric lens has a focal point, and said light emitting diode is offset slightly from said focal point.

24. The light assembly of claim 22, wherein said aspheric lens has a substantially flat inner surface and a convex outer surface.

* * * * *